(12) United States Patent
Liu

(10) Patent No.: US 11,302,395 B2
(45) Date of Patent: Apr. 12, 2022

(54) APPARATUS HAVING TRANSISTORS WITH RAISED EXTENSION REGIONS

(71) Applicant: MICRON TECHNOLOGY, INC., Boise, ID (US)

(72) Inventor: Haitao Liu, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 70 days.

(21) Appl. No.: 16/451,143

(22) Filed: Jun. 25, 2019

(65) Prior Publication Data

US 2020/0411096 A1 Dec. 31, 2020

(51) Int. Cl.
| | | |
|---|---|---|
| *G11C 16/04* | (2006.01) | |
| *G11C 5/06* | (2006.01) | |
| *H01L 27/11524* | (2017.01) | |
| *H01L 27/11582* | (2017.01) | |
| *H01L 27/11556* | (2017.01) | |
| *H01L 27/1157* | (2017.01) | |
| *H01L 27/11573* | (2017.01) | |
| *H01L 27/11529* | (2017.01) | |

(52) U.S. Cl.
CPC .......... *G11C 16/0483* (2013.01); *G11C 5/063* (2013.01); *H01L 27/1157* (2013.01); *H01L 27/11524* (2013.01); *H01L 27/11529* (2013.01); *H01L 27/11556* (2013.01); *H01L 27/11573* (2013.01); *H01L 27/11582* (2013.01)

(58) Field of Classification Search
CPC combination set(s) only.
See application file for complete search history.

(56) References Cited

U.S. PATENT DOCUMENTS

| | | | | |
|---|---|---|---|---|
| 10,756,725 | B2 * | 8/2020 | Jordanger | ............ H03K 17/166 |
| 2006/0157797 | A1 * | 7/2006 | Tateshita | ......... H01L 21/823814 257/369 |
| 2007/0132057 | A1 * | 6/2007 | Curello | ............ H01L 21/26506 257/510 |
| 2007/0194387 | A1 * | 8/2007 | Dyer | ............... H01L 21/823871 257/369 |
| 2009/0321838 | A1 * | 12/2009 | Sell | ................. H01L 21/823807 257/369 |
| 2012/0126331 | A1 * | 5/2012 | Lin | ................... H01L 29/41783 257/369 |
| 2013/0320457 | A1 * | 12/2013 | Lim | .................... H01L 29/7848 257/369 |
| 2014/0117421 | A1 * | 5/2014 | Seo | ................. H01L 21/823814 257/288 |
| 2016/0351709 | A1 * | 12/2016 | Nishikawa | ...... H01L 21/823418 |
| 2017/0244055 | A1 * | 8/2017 | Bangsaruntip | .... H01L 21/02623 |

* cited by examiner

*Primary Examiner* — Telly D Green
(74) *Attorney, Agent, or Firm* — Dicke, Billig & Czaja, PLLC

(57) ABSTRACT

Apparatus having a transistor connected between a voltage node and a load node, where the transistor includes a dielectric overlying a semiconductor having a first conductivity type, a conductor overlying the dielectric, first and second extension region bases formed in the semiconductor and having a second conductivity type, first and second extension region risers formed overlying respective first and second extension region bases and having the second conductivity type, and first and second source/drain regions formed in respective first and second extension region risers and having the second conductivity type at greater conductivity levels than their respective extension region risers, as well as method of forming similar transistors.

23 Claims, 15 Drawing Sheets

APPARATUS HAVING TRANSISTORS WITH RAISED EXTENSION REGIONS

TECHNICAL FIELD

The present disclosure relates generally to integrated circuits and, in particular, in one or more embodiments, the present disclosure relates to apparatus containing transistor with raised extension regions and methods of forming such transistors.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In a memory device, access of memory cells (e.g., programming memory cells) often utilizes high voltage levels delivered to the control gates of those memory cells, which might exceed 20V. Gating such voltage levels often relies on transistors, such as field-effect transistors (FETs), having high breakdown voltages. One technique for creating transistors with high breakdown voltages uses a lightly-doped region between a source/drain region and the control gate of the transistor. This region is sometimes referred to as an extension region. Such transistors often require relatively high levels of surface area of a substrate on which an integrated circuit device is fabricated.

DETAILED DESCRIPTION

Figure 1:
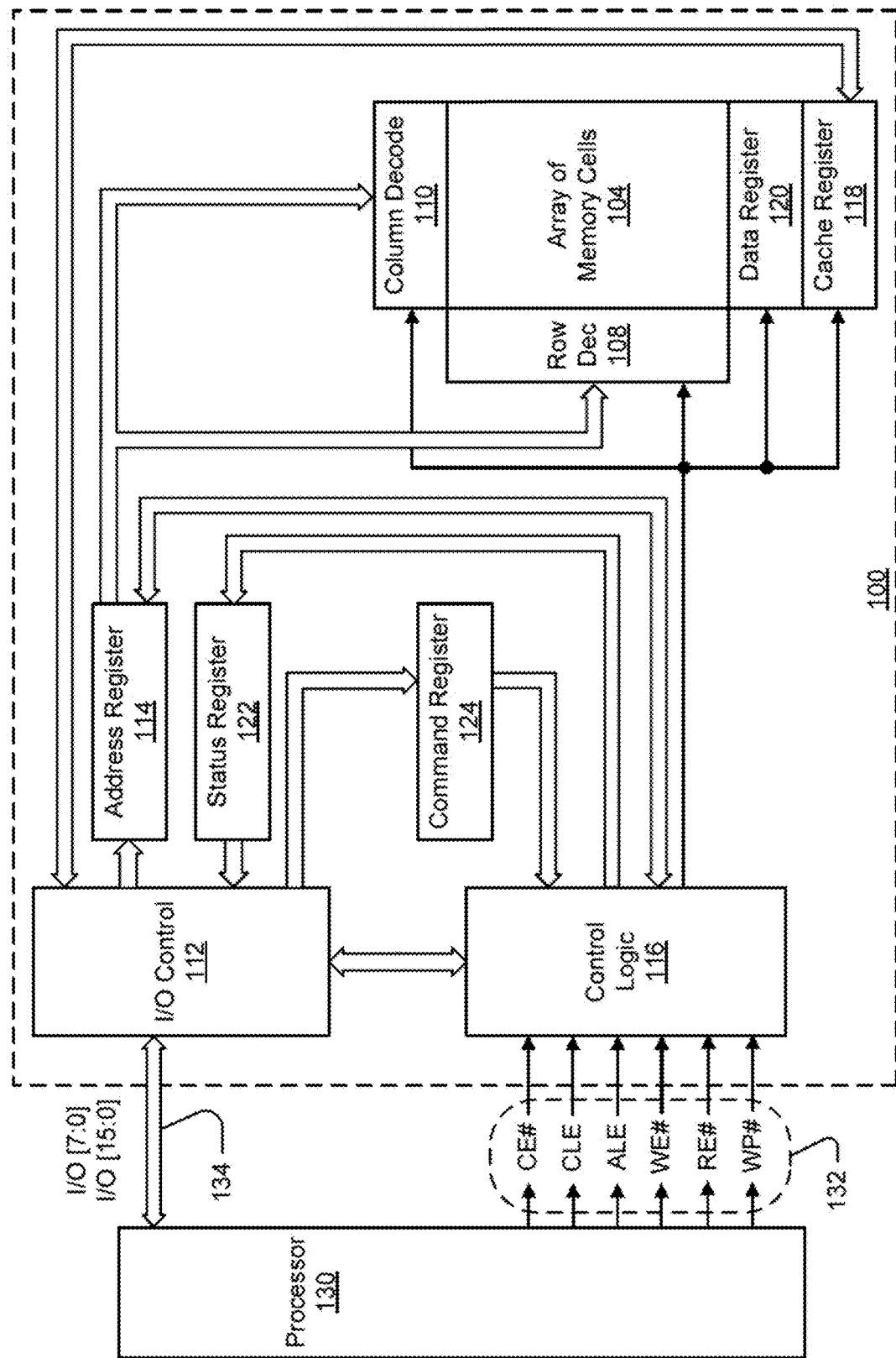
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context.

It is recognized herein that even where values may be intended to be equal, variabilities and accuracies of industrial processing and operation may lead to differences from their intended values. These variabilities and accuracies will generally be dependent upon the technology utilized in fabrication and operation of the integrated circuit device. As such, if values are intended to be equal, those values are deemed to be equal regardless of their resulting values.

Various embodiments may facilitate high breakdown voltage transistors, e.g., field-effect transistors (FETs), through the use raised extension regions. Such embodiments may utilize smaller footprints than FETs of the prior art having similar breakdown characteristics. While transistors of various embodiments might be utilized in all types of integrated circuit devices utilizing transistors, they will be described herein with specific reference to apparatus containing memory cells, some of which are commonly referred to as memory devices or simply memory.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data may be passed from the cache register 118 to the data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. The cache register 118 and/or the data register 120 may form (e.g., may form a portion of) a data buffer (e.g., page buffer) of the memory device 100. A data buffer may further include sensing devices (not shown in FIG. 1) to sense a data state of a memory cell of the array of memory cells 104, e.g., by sensing a state of a data line connected to that memory cell. A status register 122 may be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may then be written into command register 124. The addresses may be received over input/output (I/O) pins [7:0] of I/O bus 134 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) may be used in the various embodiments.

Figure 2A:
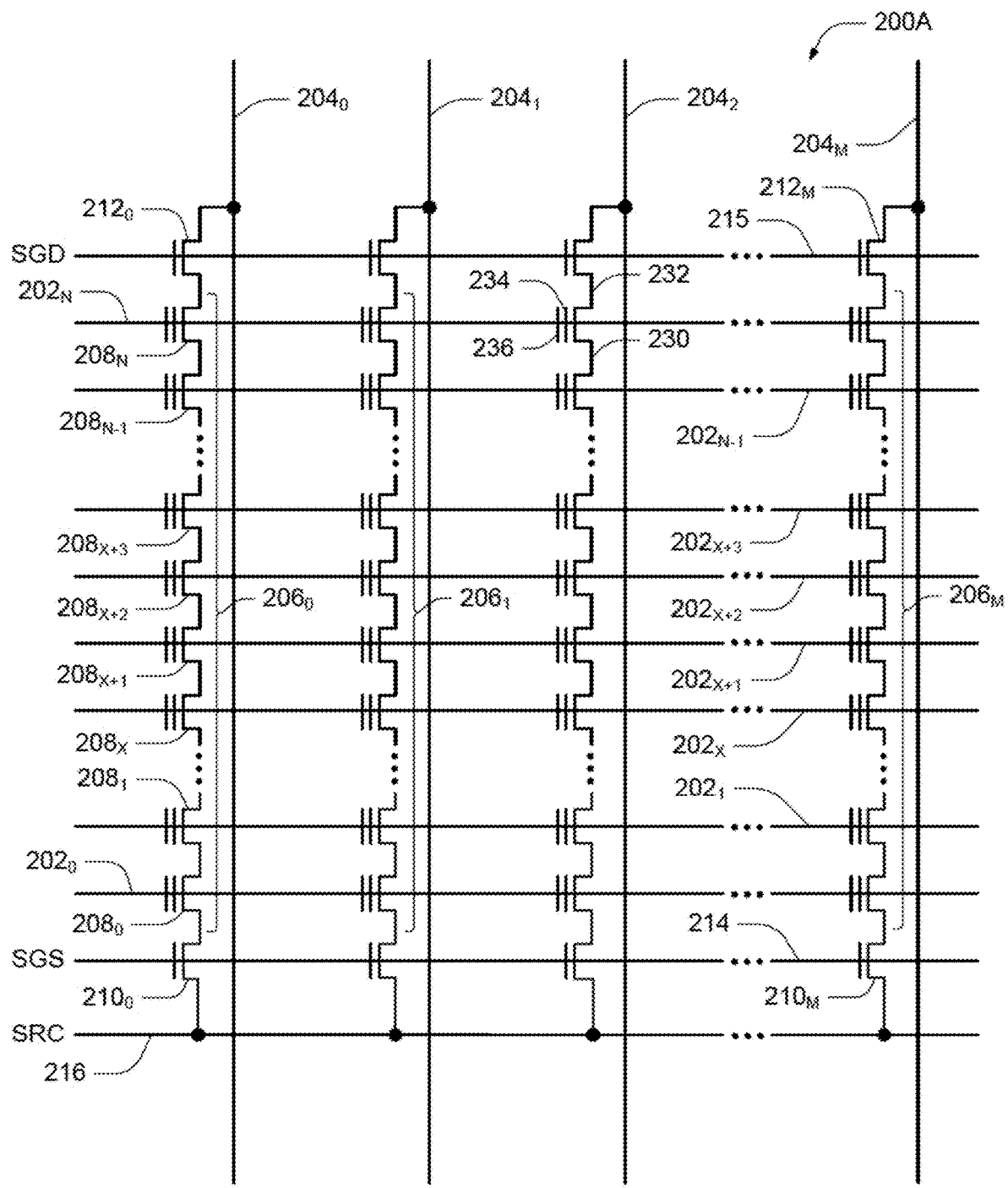
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 2B:
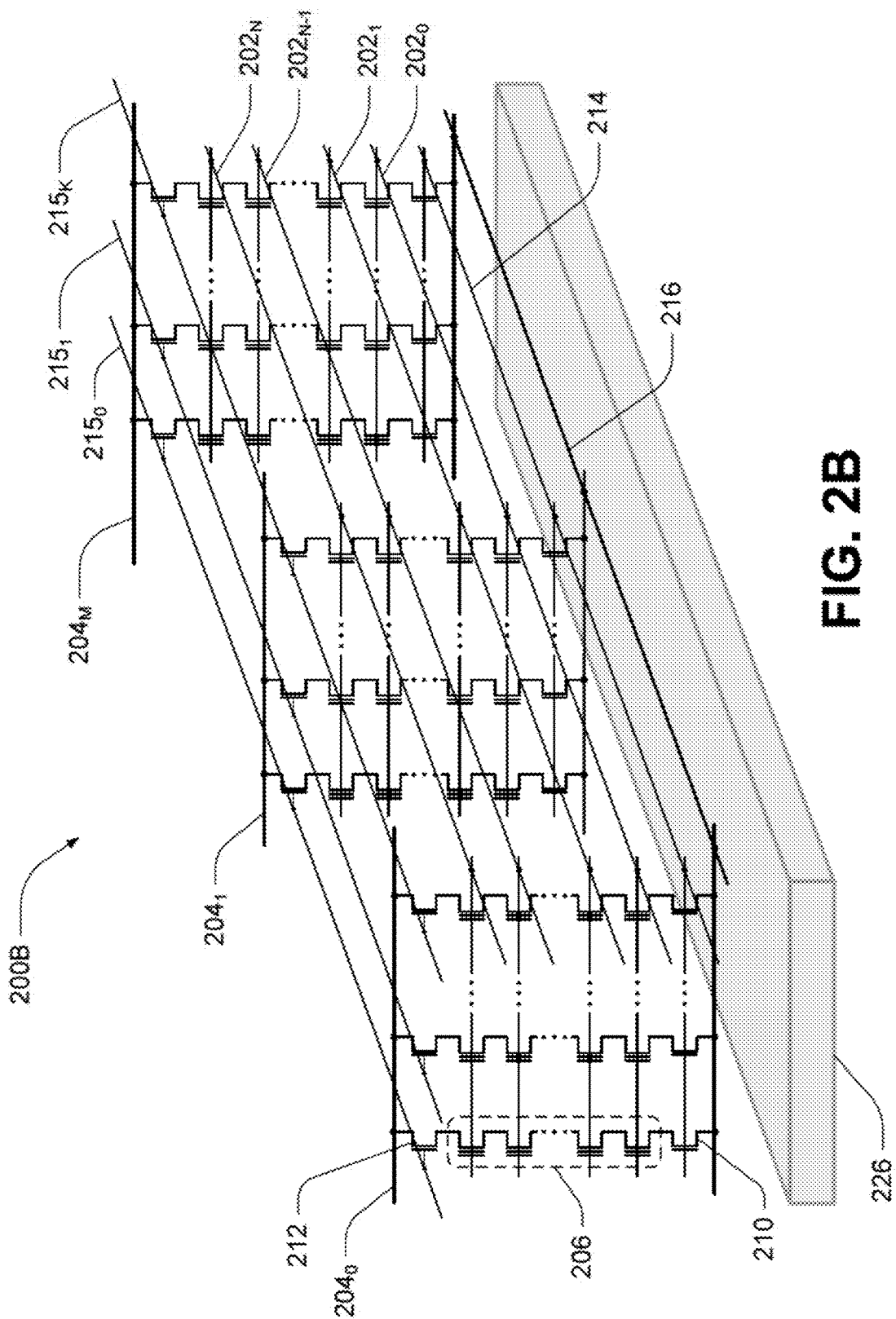

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include string drivers (not shown in FIG. 2B) for connection to word lines 202 of the memory array 200B and having transistors in accordance with embodiments. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
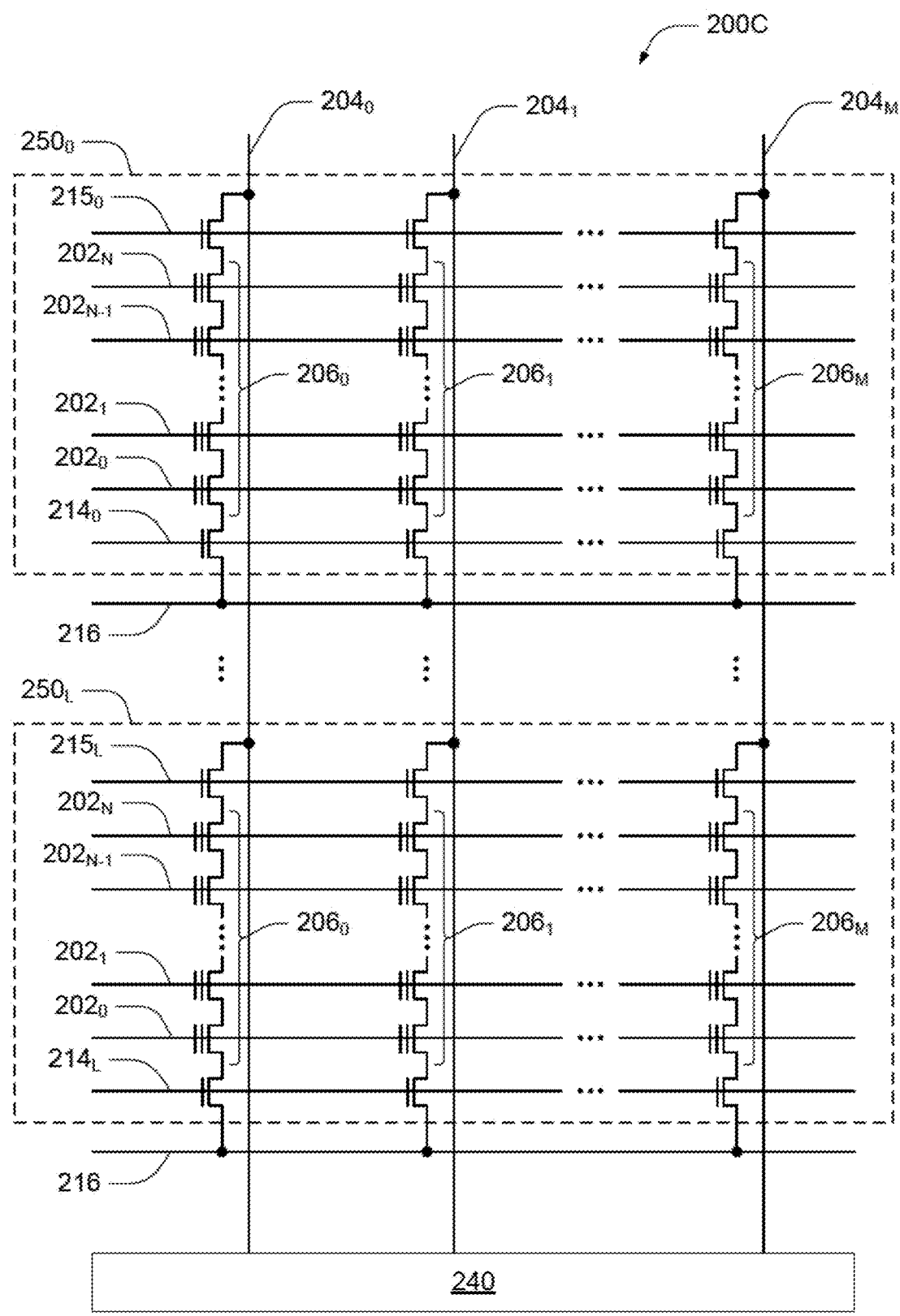

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$-$250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$-$215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3A:
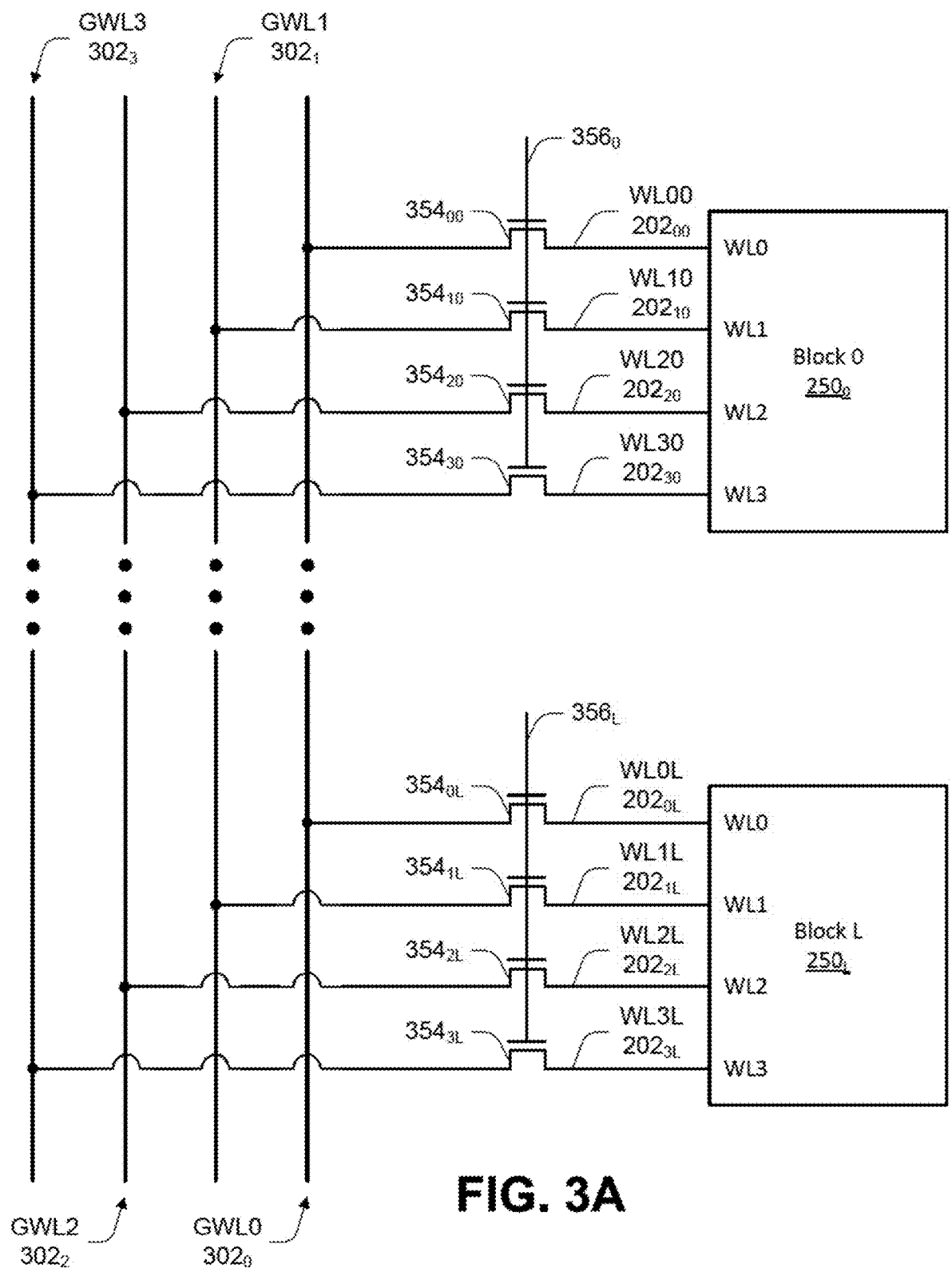
FIG. 3A is a schematic of a portion of an array of memory cells and string drivers as could be used in a memory device of the type described with reference to FIG. 1.

FIG. 3A is a schematic of a portion of an array of memory cells and string drivers as could be used in a memory device of the type described with reference to FIG. 1 and depicting a many-to-one relationship between local access lines (e.g., word lines 202) and global access lines (e.g., global word lines 302).

As depicted in FIG. 3A, a plurality of memory blocks 250 may have their local access lines (e.g., word lines 202) commonly selectively connected to a plurality of global access lines (e.g., global word lines 302). Although FIG. 3A depicts only memory blocks $250_0$ and $250_L$ (Block 0 and Block L), additional memory blocks 250 may have their word lines 202 commonly connected to global word lines 302 in a like manner. Similarly, although FIG. 3A depicts only four word lines 202, memory blocks 250 may include fewer or more word lines 202.

To facilitate memory access operations to specific memory blocks 250 commonly coupled to a given set of global word lines 302, each memory block 250 may have a corresponding set of block select transistors 354 in a one-to-one relationship with their word lines 202. Control gates of the set of block select transistors 354 for a given memory block 250 may have their control gates commonly coupled to a corresponding block select line 356. For example, for memory block $250_0$, word line $202_{00}$ may be selectively connected to global word line $302_0$ through block select transistor $354_{00}$, word line $202_{10}$ may be selectively connected to global word line $302_1$ through block select transistor $354_{10}$, word line $202_{20}$ may be selectively connected to global word line $302_2$ through block select transistor $354_{20}$, and word line $202_{30}$ may be selectively connected to global word line $302_3$ through block select transistor $354_{30}$, while block select transistors $354_{00}$-$354_{30}$ are responsive to a control signal received on block select line $356_0$. The block select transistors 354 for a block of memory cells 250 might collectively be referred to as a string driver, or simply driver circuitry.

Figure 3B:
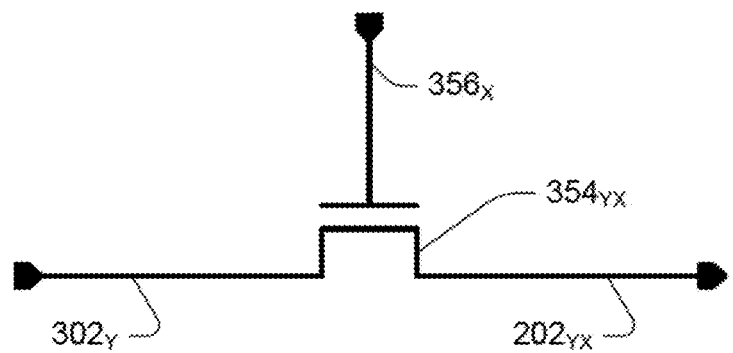
FIG. 3B is a schematic of a portion of one example of a string driver as could be used in a memory of the type described with reference to FIG. 1.

FIG. 3B is a schematic of a portion of one example of a string driver as could be used in a memory of the type described with reference to FIG. 1. The portion of the string driver of FIG. 3B depicts one transistor, e.g., block select transistor $354_{YX}$, responsive to a control signal node, e.g., block select line $356_X$, and connected between a voltage node, e.g., a global word line $302_Y$, configured to supply a voltage level, and load node, e.g., local word line $202_{YX}$, configured to receive that voltage level. For example, the block select transistor $354_{YX}$ might represent the block select transistor $354_{10}$ having a control gate connected to the block select line $356_0$ and connected between the global word line $302_1$ and the local word line $202_{10}$ of the block of memory cells $250_0$. The block select transistor $356_{YX}$ might be a high-voltage n-type FET or nFET.

Figure 3C:
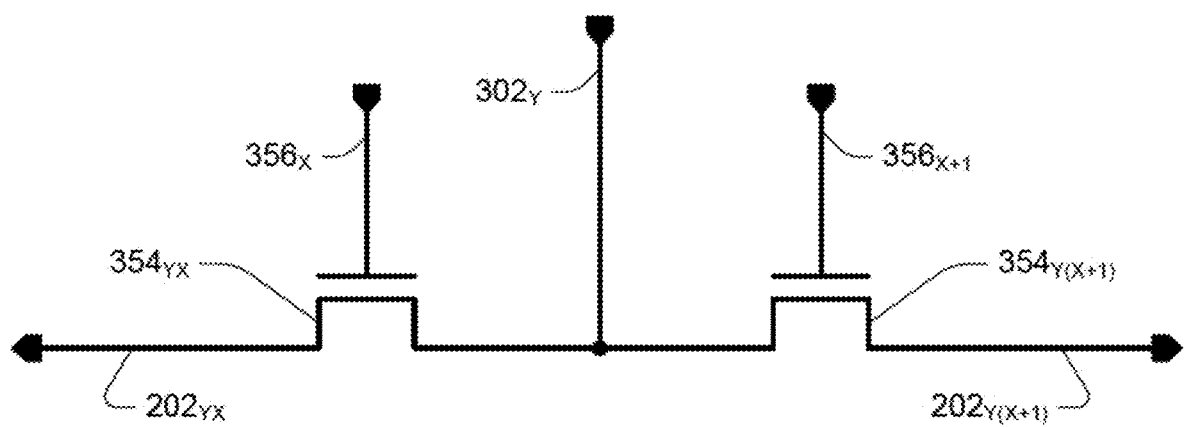
FIG. 3C is a schematic of a portion of another example of a string driver as could be used in a memory of the type described with reference to FIG. 1.

FIG. 3C is a schematic of a portion of another example of a string driver as could be used in a memory of the type described with reference to FIG. 1. The portion of the string driver of FIG. 3C depicts two transistors, e.g., block select transistor $354_{YX}$ and block select transistor $354_{Y(X+1)}$. Block select transistor $354_{YX}$ is responsive to a control signal node, e.g., block select line $356_X$, and connected between a voltage node, e.g., a global word line $302_Y$, configured to supply a voltage level, and load node, e.g., local word line $202_{YX}$, configured to receive that voltage level. For example, the block select transistor $354_{YX}$ might represent the block select transistor $354_{10}$ having a control gate connected to the block select line $356_0$ and connected between the global word line $302_1$ and the local word line $202_{10}$ of the block of memory cells $250_0$.

Block select transistor $354_{Y(X+1)}$ is responsive to a control signal node, e.g., block select line $356_{X+1}$, and connected between a voltage node, e.g., the global word line $302_Y$, configured to supply a voltage level, and load node, e.g., local word line $202_{Y(X+1)}$, configured to receive that voltage level. For example, the block select transistor $354_{Y(X+1)}$ might represent the block select transistor 3541L having a control gate connected to the block select line 356L and connected between the global word line $302_1$ and the local word line $202_{1L}$ of the block of memory cells $250_L$. The block select transistors $356_{YX}$ and $356_{Y(X+1)}$ might each be high-voltage n-type FETs or nFETs.

Figure 4A:
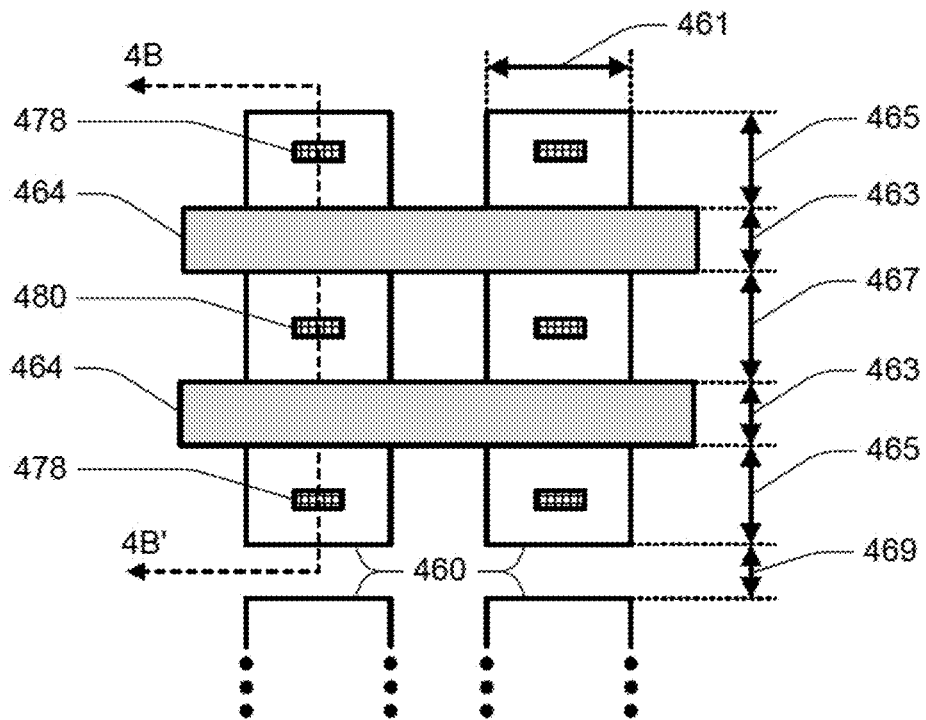
FIG. 4A is a plan view of transistors of the related art.

FIG. 4A is a plan view of transistors of the related art. The transistors of FIG. 4A might be represented by a schematic such as depicted in FIG. 3C. In FIG. 4A, the transistors are formed in an active area 460 of a semiconductor. Each transistor might be formed between a first contact 480, e.g., for connection to a voltage node, and a second contact 478, e.g., for connection to a load node. Such transistors might be responsive to a control signal received on a conductor 464, which might be connected to (and might form) a control gate of one or more transistors.

Each active area 460 might have a width 461. A distance 463 might represent a width of a conductor 464, a distance 465 might represent the distance between an edge (e.g., nearest edge) of a conductor 464 and an end (e.g., nearest end) of the active area 460, a distance 467 might represent a distance between adjacent edges of the conductors 464, and a distance 469 might represent a distance between adjacent ends of active areas 460. An active area 460 might have a length equal to a sum of the distances 463, 465 and 467 between its ends.

Figure 4B:
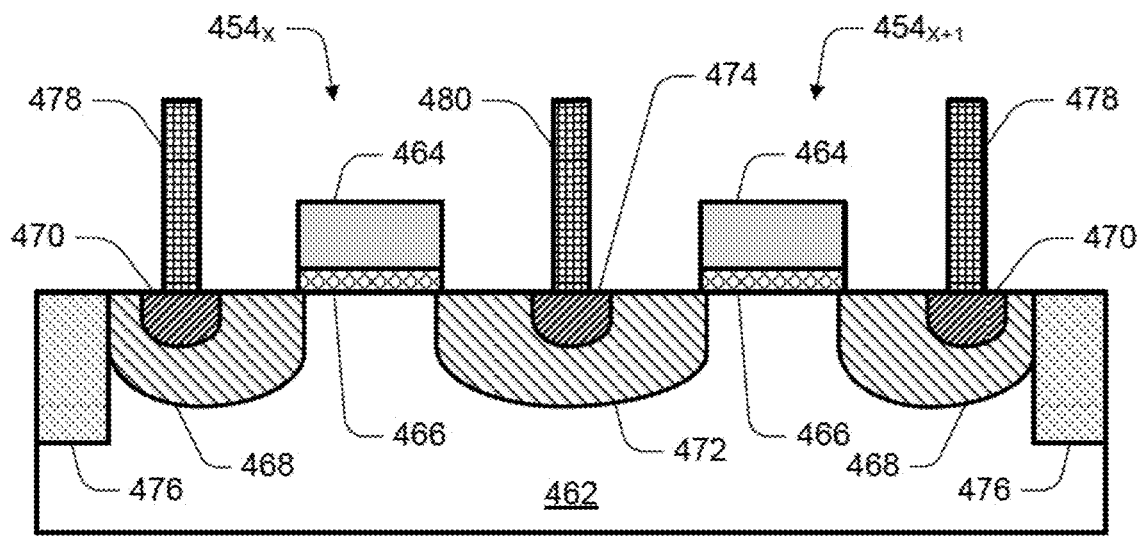
FIG. 4B is a cross-sectional view of transistors of FIG. 4A.

FIG. 4B is a cross-sectional view of transistors of FIG. 4A taken along line 4B-4B'. FIG. 4B depicts two transistors 454, e.g., $454_X$ and $454_{X+1}$, which might correspond to transistors $354_{YX}$ and $354_{Y(X+1)}$ of FIG. 3C. The transistors 454 are formed overlying (e.g., on) a semiconductor 462. The semiconductor 462 might contain monocrystalline silicon or other semiconductor material. The semiconductor 462 might have a conductivity type, e.g., a p-type conductivity. Isolation regions 476 might be formed in the semiconductor 462 to define the active areas 460 of FIG. 4A.

A gate stack of each transistor 454 of FIG. 4B might include a dielectric 466 formed overlying (e.g., on) the semiconductor 462, and a conductor 464 formed overlying (e.g., on) a corresponding gate dielectric 466. The dielectric 466 might generally be formed of one or more dielectric materials, while the conductor 464 might generally be formed of one or more conductive materials. The dielectric 466 might correspond to a gate dielectric of its corresponding transistor 454, while the conductor 464 might correspond to a control gate of that corresponding transistor 454.

A first extension region 472 might be formed in the semiconductor 462 between the gate stacks of the transistors 454. The first extension region 472 might have a conductivity type different than (e.g., opposite of) the conductivity type of the semiconductor 462. Continuing with the example, the first extension region 472 might have an n-type conductivity. The conductivity level of the first extension region 472 might be referred to as lightly doped, e.g., having an n− conductivity. To produce an n-type conductivity in a p-type substrate, a dopant species might include ions of arsenic (As), antimony (Sb), phosphorus (P) or another n-type impurity. Alternatively, to produce a p-type conductivity in an n-type substrate, a dopant species might include ions of boron (B) or another p-type impurity.

A first source/drain region (e.g., source) 474 might be formed in the first extension region 472. The first source/drain region 474 might have a conductivity type the same as the conductivity type of the first extension region 472, but at a higher conductivity level. For example, the first source/drain region 474 might have an n+conductivity. The difference in conductivity levels might correspond to different levels of impurities, e.g., dopant species, implanted in the semiconductor 462. The level of impurities of the first source/drain region 474 might be an order of magnitude or more than the level of impurities of the first extension region 472. As one example, an n− conductivity might represent an impurity level of 1E16~1E19 ions/cm$^3$ while an n+conductivity might represent an impurity level of greater than or equal to 1E20 ions/cm$^3$.

A first contact 480 might be formed to be connected to the first source/drain region 474. The first contact 480 might generally be formed of one or more conductive materials. The first contact 480 might be configured to receive a voltage level to provide to the first source/drain region 474. For example, the first contact 480 might be configured to connect to a global word line 302 of FIG. 3A.

A second extension region 468 might be formed in the semiconductor 462 adjacent each gate stack of the transistors 454. The second extension region 468 might have a conductivity type different than (e.g., opposite of) the conductivity type of the semiconductor 462. Continuing with the example, the second extension region 468 might have an n-type conductivity. The conductivity level of the second extension region 468 might be referred to as lightly doped, e.g., having an n− conductivity.

A second source/drain region (e.g., drain) 470 might be formed in each second extension region 468. The second source/drain regions 470 might have a conductivity type the same as the conductivity type of the second extension region 468, but at a higher conductivity level. For example, the second source/drain regions 470 might have an n+ conductivity. The difference in conductivity levels might correspond to different levels of impurities, e.g., dopant species, implanted in the semiconductor 462. The level of impurities of the second source/drain regions 470 might be an order of magnitude or more than the level of impurities of the second extension regions 468.

A second contact 478 might be formed to be connected to each second source/drain region 470. The second contacts 478 might generally be formed of one or more conductive materials. Each second contact 478 might be configured to provide a voltage level at its second source/drain region 470 to a load. For example, the second contact 478 might be configured to connect to a local word line 202 of FIG. 3A.

Figure 5A:
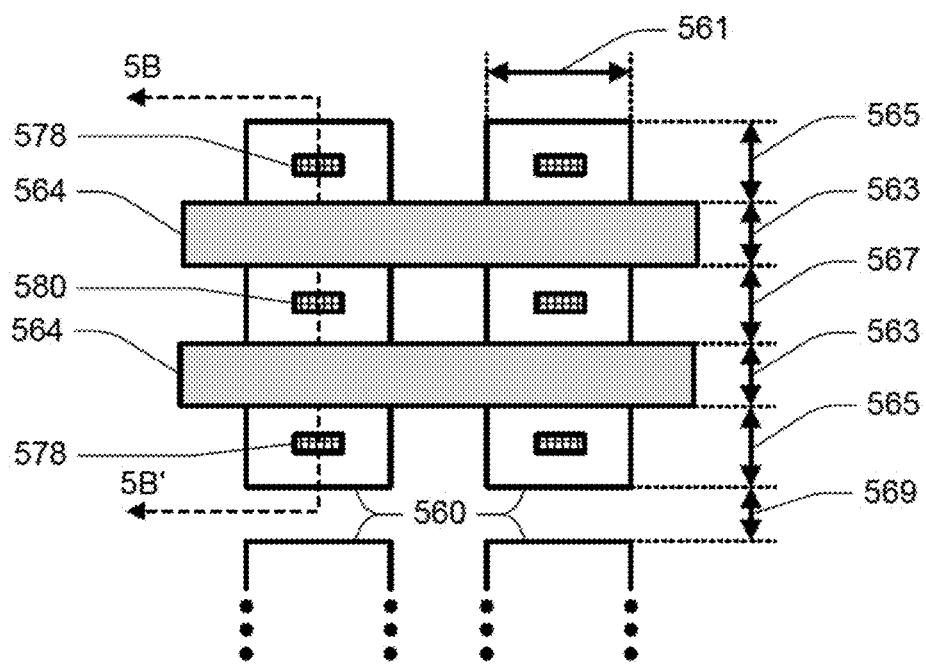
FIG. 5A is a plan view of transistors in accordance with an embodiment.

FIG. 5A is a plan view of transistors in accordance with an embodiment. The transistors of FIG. 5A might be represented by a schematic such as depicted in FIG. 3C. In FIG. 5A, the transistors are formed in an active area 560 of a semiconductor. Each transistor might be formed between a first contact 580, e.g., for connection to a voltage node, and a second contact 578, e.g., for connection to a load node. Such transistors might be responsive to a control signal received on a conductor 564, which might be connected to (and might form) a control gate of one or more transistors.

Figure 5B:
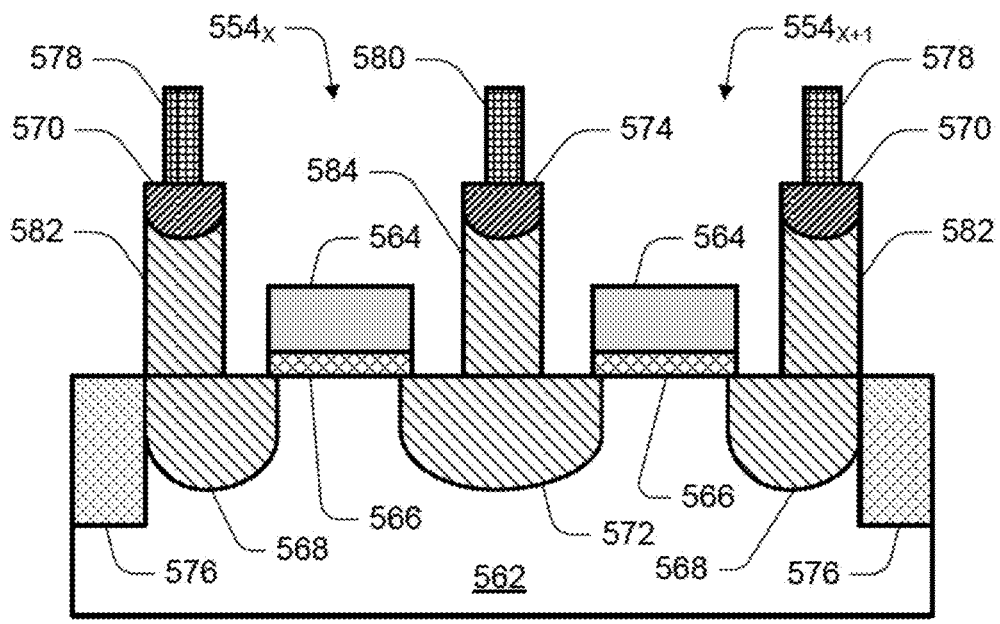
FIG. 5B is a cross-sectional view of transistors of FIG. 5A.

Each active area 560 might have a width 561. A distance 563 might represent a width of a conductor 564, a distance 565 might represent the distance between an edge (e.g., nearest edge) of a conductor 564 and an end (e.g., nearest end) of the active area 560, a distance 567 might represent a distance between adjacent edges of the conductors 564, and a distance 569 might represent a distance between adjacent ends of active areas 560. An active area 560 might have a length equal to a sum of the distances 563, 565 and 567 between its ends. For some embodiments, the distances 561, 563 and 569 of FIG. 5A might be substantially equal to distances 461, 463 and 469, respectively, of FIG. 4A FIG. 5B is a cross-sectional view of transistors of FIG. 5A taken along line 5B-5B'. FIG. 5B depicts two transistors 554, e.g., $554_X$ and $554_{X+1}$, which might correspond to transistors $354_{YX}$ and $354_{Y(X+1)}$ of FIG. 3C. The transistors 554 are formed overlying (e.g., on) a semiconductor 562. The semiconductor 562 might contain monocrystalline silicon or other semiconductor material. The semiconductor 562 might have a conductivity type, e.g., a p-type conductivity. Isolation regions 576 might be formed in the semiconductor 562 to define the active areas 560 of FIG. 5A.

A gate stack of each transistor 554 of FIG. 5B might include a dielectric 566 formed overlying (e.g., on) the semiconductor 562, and a conductor 564 formed overlying (e.g., on) a corresponding gate dielectric 566. The dielectric 566 might generally be formed of one or more dielectric materials, while the conductor 564 might generally be formed of one or more conductive materials. The dielectric 566 might correspond to a gate dielectric of its corresponding transistor 554, while the conductor 564 might correspond to a control gate of that corresponding transistor 554.

A first extension region base 572 might be formed in the semiconductor 562 between the gate stacks of the transistors 554. The first extension region base 572 might have a conductivity type different than (e.g., opposite of) the conductivity type of the semiconductor 562. Continuing with the example, the first extension region base 572 might have an n-type conductivity. The conductivity level of the first extension region base 572 might be referred to as lightly doped, e.g., having an n− conductivity. To produce an n-type conductivity in a p-type substrate, a dopant species might include ions of arsenic (As), antimony (Sb), phosphorus (P) or another n-type impurity. Alternatively, to produce a p-type conductivity in an n-type substrate, a dopant species might include ions of boron (B) or another p-type impurity.

A first extension region riser 584 might be formed overlying the first extension region base 572. The first extension region riser 584 might have a conductivity type the same as the conductivity type of the first extension region base 572, and at a similar (e.g., same) conductivity level. The first extension region riser 584 might have similar (e.g., the same) materials of construction as the first extension region base 572. For example, if the semiconductor 562 is monocrystalline silicon, the first extension region riser 584 might be a conductively doped monocrystalline silicon. Alternatively, the first extension region riser 584 might be constructed of other semiconductor materials.

A first source/drain region (e.g., source) 574 might be formed in the first extension region riser 584. The first source/drain region 574 might have a conductivity type the same as the conductivity type of the first extension region riser 584, but at a higher conductivity level. For example, the first source/drain region 574 might have an n+conductivity. The difference in conductivity levels might correspond to different levels of impurities, e.g., dopant species, implanted in the semiconductor material of the first extension region riser 584. The level of impurities of the first source/drain region 574 might be an order of magnitude or more than the level of impurities of the first extension region riser 584. As one example, an n− conductivity might represent an impurity level 1E16~1E19 ions/cm$^3$ while an n+conductivity might represent an impurity level of greater than or equal to 1E20 ion/cm$^3$.

A first contact 580 might be formed to be connected to the first source/drain region 574. The first contact 580 might generally be formed of one or more conductive materials. The first contact 580 might be configured to receive a voltage level to provide to the first source/drain region 574. For example, the first contact 580 might be configured to connect to a global word line 302 of FIG. 3A.

A second extension region base 568 might be formed in the semiconductor 562 adjacent each gate stack of the transistors 554. The second extension region base 568 might have a conductivity type different than (e.g., opposite of) the conductivity type of the semiconductor 562. Continuing with the example, the second extension region base 568 might have an n-type conductivity. The conductivity level of the second extension region base 568 might be referred to as lightly doped, e.g., having an n− conductivity.

A second extension region riser 582 might be formed overlying the second extension region base 568. The second extension region riser 582 might have a conductivity type the same as the conductivity type of the second extension region base 568, and at a similar (e.g., same) conductivity level. The second extension region riser 582 might have similar (e.g., the same) materials of construction as the second extension region base 568. For example, if the semiconductor 562 is monocrystalline silicon, the second extension region riser 582 might be a conductively doped monocrystalline silicon. Alternatively, the second extension region riser 582 might be constructed of other semiconductor materials.

A second source/drain region (e.g., drain) 570 might be formed in each second extension region riser 582. The second source/drain regions 570 might have a conductivity type the same as the conductivity type of the second extension region riser 582, but at a higher conductivity level. For example, the second source/drain regions 570 might have an n+ conductivity. The difference in conductivity levels might correspond to different levels of impurities, e.g., dopant species, implanted in the semiconductor 562. The level of impurities of the second source/drain regions 570 might be an order of magnitude or more than the level of impurities of the second extension region riser 582.

A second contact 578 might be formed to be connected to each second source/drain region 570. The second contacts 578 might generally be formed of one or more conductive materials. Each second contact 578 might be configured to provide a voltage level at its second source/drain region 570 to a load. For example, the second contact 578 might be configured to connect to a local word line 202 of FIG. 3A.

The use of the first extension region riser 584 and/or the second extension region riser 582 might facilitate a reduction in lateral spacing between the first contact 580 and an isolation region 576 over the structure of FIG. 4B. For example, use of the first extension region riser 584 of FIG. 5B might facilitate a reduction in lateral spacing between the first contact 580 and the conductor 564 of a transistor 554. The use of the first extension region riser 584 might further provide a same or increased length of the extension region between the first source/drain region 574 and the channel of a transistor 554 as compared to the extension region between the first source/drain region 474 and the channel of a transistor 454 of FIG. 4B. Similarly, use of the second extension region riser 582 of FIG. 5B might facilitate a reduction in lateral spacing between the second contact 578 and the conductor 564 of a transistor 554. The use of the second extension region riser 582 might further provide a same or increased length of the extension region between the second source/drain region 570 and the channel of a transistor 554 as compared to the extension region between the second source/drain region 470 and the channel of a transistor 454 of FIG. 4B. Furthermore, use of the second extension region riser 582 of FIG. 5B might facilitate a reduction in lateral spacing between the second contact 578 and an adjacent isolation region 576 as there might be no need to laterally separate the second source/drain region 570 from the adjacent isolation region 576 in a manner as depicted between the second source/drain region 470 and an adjacent isolation region 476.

Figure 6A:
FIGS. 6A-6H are cross-sectional views of the transistors of FIG. 5B at various states of fabrication in accordance with an embodiment.

FIGS. 6A-6H are cross-sectional views of the transistors of FIG. 5B at various states of fabrication in accordance with an embodiment. In FIG. 6A, isolation regions 576 are formed in a semiconductor 562. The semiconductor 562 may comprise silicon, such as monocrystalline silicon, or other semiconductor material. The semiconductor 562 might have a conductivity type, such as a p-type conductivity. Isolation regions 576 might represent shallow-trench isolation structures as are well understood in the relevant art. For example, the isolation regions 576 might be formed by forming trenches in the semiconductor 562, and filling those trenches with one or more dielectric materials.

Figure 6B:
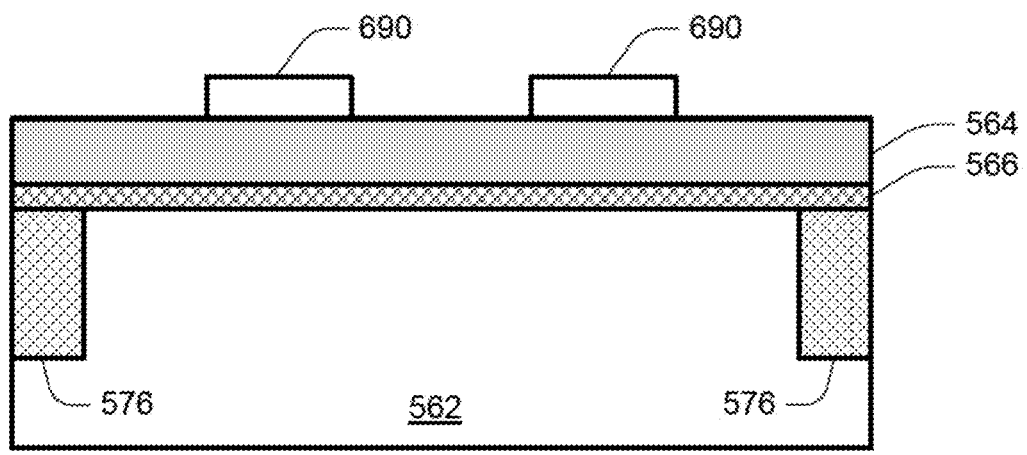

In FIG. 6B, a dielectric 566 might be formed overlying (e.g., on) the structure of FIG. 6A, e.g., overlying the semiconductor 562 and isolation regions 576. The dielectric 566 might be formed of one or more dielectric materials. For example, the dielectric 566 may comprise, consist of, or consist essentially of an oxide, e.g., silicon dioxide, and/or may comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material.

A conductor 564 might be formed overlying (e.g., on) the dielectric 566. The conductor 564 might be formed of one or more conductive materials. The conductor 564 may comprise, consist of, or consist essentially of conductively doped polysilicon and/or may comprise, consist of, or consist essentially of metal, such as a refractory metal, or a metal-containing material, such as a refractory metal silicide or a metal nitride, e.g., a refractory metal nitride, as well as any other conductive material.

A patterned mask 690 might be formed overlying (e.g., on) the conductor 564 to expose areas of the conductor 564 and dielectric 566 for removal. The mask 690 might represent a mask formed using a photolithographic process. Photolithographic processes are often used to define a desired pattern in integrated circuit fabrication. In a photolithographic process, a photoresist layer may be formed on the surface of the in-process device. The photoresist layer may contain a photo-sensitive polymer whose ease of removal is altered upon exposure to light or other electromagnetic radiation. To define the pattern, the photoresist layer may be selectively exposed to radiation and then developed to expose portions of the underlying layer. In a positive resist system, the portions of the photoresist layer exposed to the radiation are photosolubilized and a photolithographic mask is designed to block the radiation from those portions of the photoresist layer that are to remain after developing. In a negative resist systems, the portions of the photoresist layer exposed to the radiation are photopolymerized and the photolithographic mask is designed to block the radiation from those portions of the photoresist layer that are to be removed by developing.

Figure 6C:
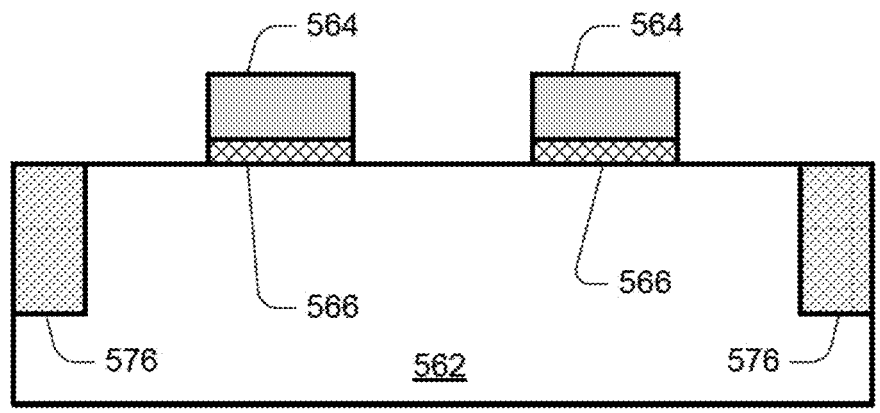

In FIG. 6C, the exposed areas of the conductor 564 and the dielectric 566 are removed, e.g., anisotropically. For example, a reactive ion etch process might be used to remove portions of the conductor 564 and the dielectric 566 not covered by the patterned mask 690. The mask 690 might subsequently be removed, e.g., by ashing or otherwise removing the photoresist material.

Figure 6D:
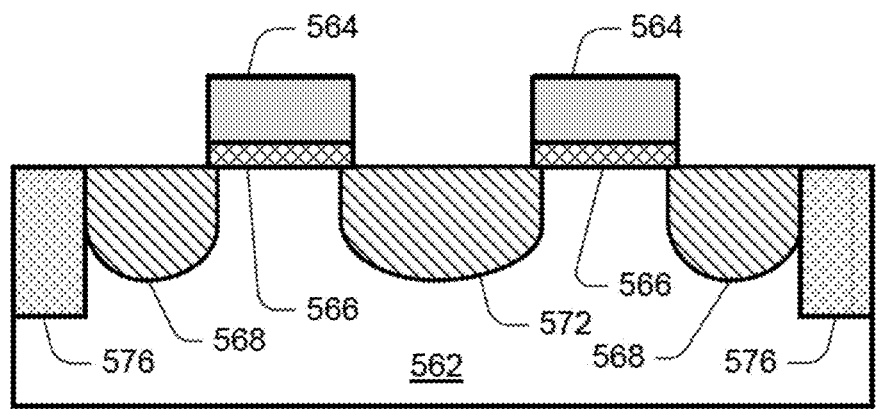

In FIG. 6D, the first extension region base 572 and the second extension region bases 568 are formed. The first extension region base 572 might extend beyond one edge of each dielectric 566, while each second extension region base 568 might extend beyond an opposite edge of its corresponding dielectric 566. The second extension region bases 568 might further extend to corresponding isolation regions 576. Forming these extension region base 568 and 572 might include conductively doping portions of the semiconductor 562 not covered by the conductor 564. For example, the first extension region base 572 and the second extension region bases 568 might be formed by implanting respective dopant species into the semiconductor 562. As is well understood in the art, such implantation might commonly involve acceleration of ions directed at a surface of the semiconductor 562. To produce an n-type conductivity, the dopant species might include ions of arsenic (As), antimony (Sb), phosphorus (P) or another n-type impurity. To produce a p-type conductivity, the dopant species might include ions of boron (B) or another p-type impurity. Other methods of forming conductive regions in a semiconductor are known. Although implanting dopant species might be self-aligned to the gate stacks, it might further be expected for the extension region bases 568 and 572 to extend beneath the dielectrics 566. A channel region would be the area between the first extension region base 572 and a second extension region base 568 underlying the dielectric 566.

Figure 6E:
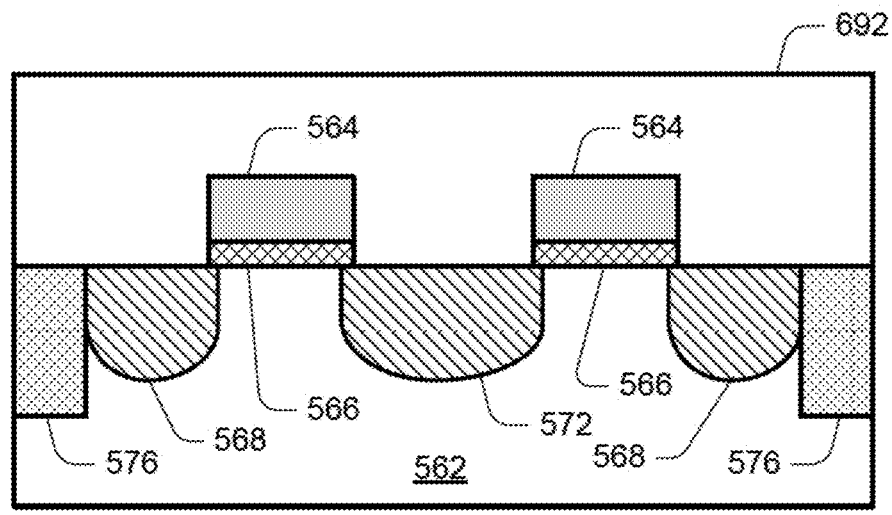
Figure 6F:
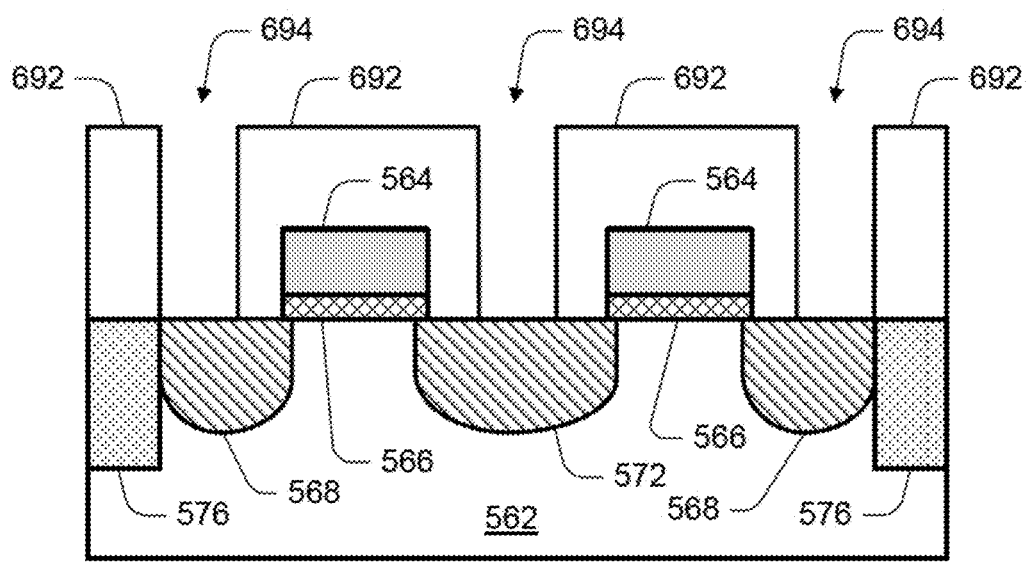
Figure 6G:
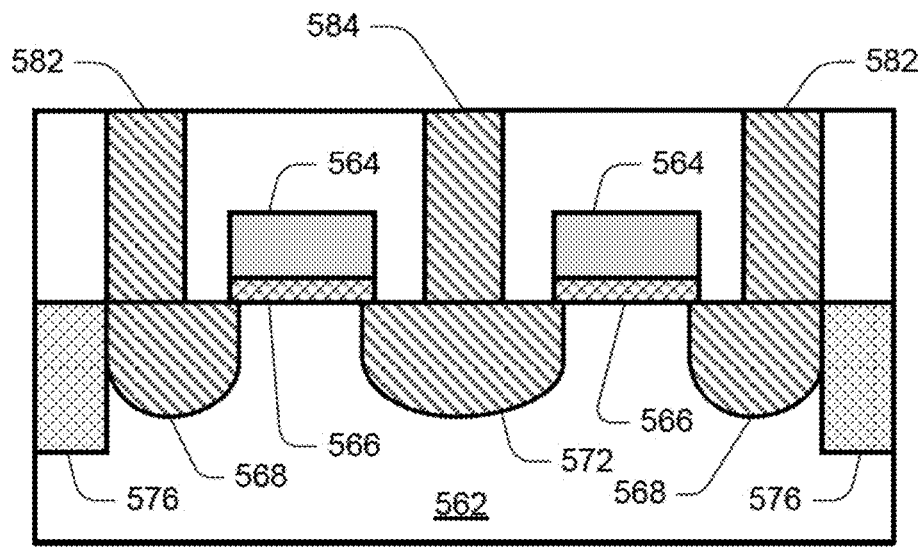

In FIG. 6E, a dielectric 692 might be formed overlying the structure of FIG. 6D. In FIG. 6F, voids 694 might be formed in the dielectric 692 to define areas for formation of the extension region risers. For example, portions of the dielectric 692 might be anisotropically removed to define voids 694. In FIG. 6G, the first extension region riser 584 and the second extension region risers 582 might be formed. Top surfaces of the first extension region riser 584 and the second extension region risers 582 might be above top surfaces of the conductors 564. The first extension region riser 584 and the second extension region risers 582 might be formed of material having characteristics similar to their corresponding first extension region base 572 and second extension region bases 568. As one example, where the semiconductor 562 contains monocrystalline silicon, amorphous or polycrystalline silicon (commonly referred to as polysilicon) might be formed in the voids 694 using chemical vapor deposition (CVD), physical vapor deposition (PVD) or atomic layer deposition (ALD), and subsequently crystallized to mimic the characteristics of the underlying extension region bases. This might be accomplished by solid phase epitaxy. For example, solid phase epitaxy might include a low temperature (e.g., 600° C. for 30 minutes) anneal.

Alternatively, a selective epitaxial growth of monocrystalline silicon might be used to form the risers. Epitaxial formation of silicon is a CVD process. The process can replicate the structure of the silicon material upon which it is formed. For example, if the base structure is of monocrystalline silicon, the epitaxial growth might maintain the same monocrystalline structure. Silicon precursors are transported to, and adsorbed on, the exposed silicon structures. Common silicon precursors for the production of epitaxial silicon include silicon tetrachloride ($SiCl_4$), trichlorosilane ($SiHCl_3$), dichlorosilane ($SiH_2Cl_2$) and silane ($SiH_4$). As a further alternative, epitaxial growth of high band-gap semiconductors might also be used. High band-gap semiconductors might be defined as semiconductors having a band gap of 1.7 eV or greater. Some high band-gap semiconductors, e.g., gallium phosphide (GaP), might be epitaxially grown on silicon to contain a single crystal lattice of that high band-gap semiconductor.

Regardless of the method of formation, conductive doping of the first extension region riser 584 and the second extension region risers 582 might be performed in conjunction with formation, or subsequent to formation. Conductive doping of the extension region risers 582 and 584 might use a same type (e.g., n-type or p-type) of doping impurity as the extension region bases 568 and 572, but to a higher level. The doping impurity might further be the same material for both the extension region risers and the extension region bases.

Figure 6H:
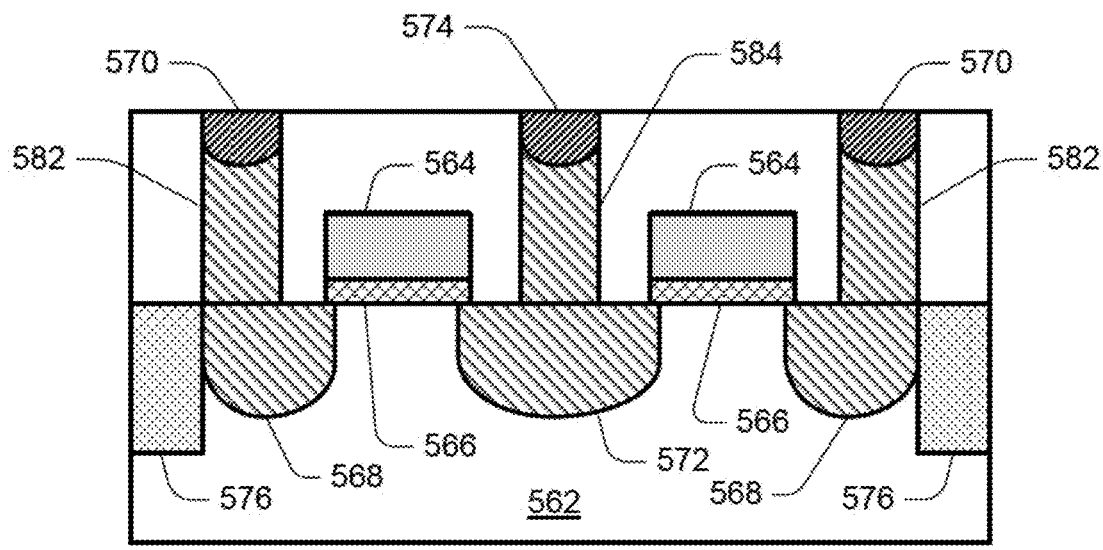

In FIG. 6H, the first source/drain region 574 and the second source/drain regions 570 might be formed in the first extension region riser 584 and the second extension region risers 582, respectively. Bottom surfaces of the first source/drain region 574 and the second source/drain regions 570 might be above top surfaces of the conductors 564. Formation of the source/drain regions 570 and 574 might include conductively doping the extension region risers 582 and 584 using a same type (e.g., n-type or p-type) of doping impurity as the extension region risers, but to a higher level. The doping impurity might further be the same material for both the extension region risers and the source/drain regions. Contacts 578 and 580 (not shown in FIG. 6H) might then be formed to be in contact with the source/drain regions 570 and 574, respectively. Although FIGS. 6A-6H described a method of forming the transistors 554 of FIG. 5B corresponding to a schematic as depicted in FIG. 3C, forming a transistor 554 corresponding to a schematic of FIG. 3B would be readily apparent with reference to the description of FIGS. 6A-6H.

Figure 7:
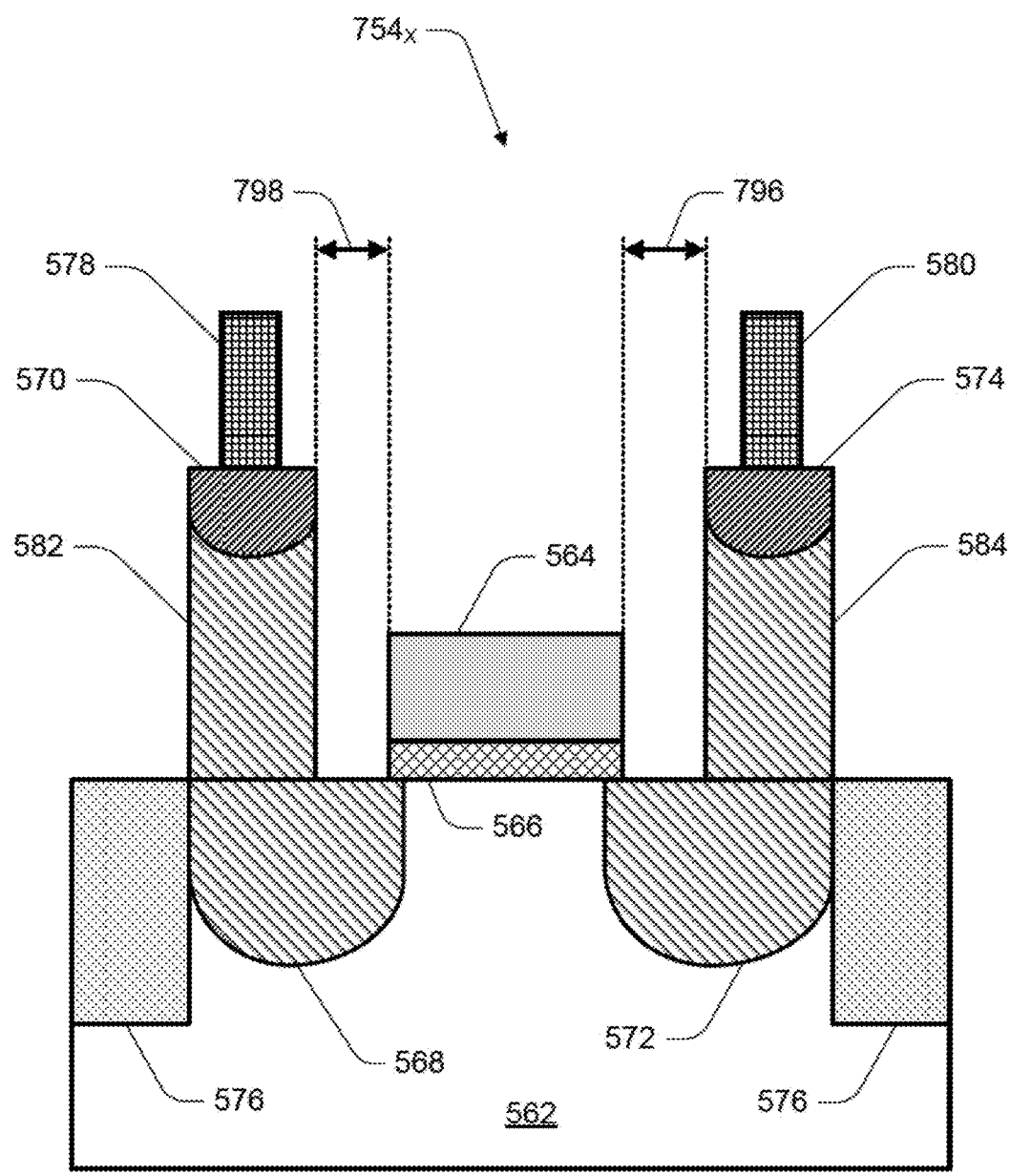
FIG. 7 is a cross-sectional view of a transistor in accordance with another embodiment.

FIG. 7 is a cross-sectional view of a transistor in accordance with another embodiment. FIG. 7 depicts one transistor 754 which might correspond to transistor $354_{YX}$ of FIG. 3B. Like reference numerals in FIG. 7 correspond to their description with respect to the embodiment of FIG. 5B. The transistor 754 depicts that the first extension region riser 584 might be formed to be aligned with an isolation region 576, similar to the second extension region riser 582.

FIG. 7 further depicts that the distance (e.g., lateral distance) 796 between the first extension region riser 584 and the conductor 564 might be different than the distance (e.g., lateral distance) 798 between the second extension region riser 582 and the conductor 564. For example, if it is desired to have different lengths of the extension regions between the source side and the drain side of the transistor 754, e.g., due to an expected voltage drop across the transistor 754, having different distances 796 and 798 might facilitate obtaining differing lengths of extension regions while maintaining a same height of the extension region risers 582 and 584. For example, the distance 796 might be larger than the distance 798. This variation of distances 796 and 798 might also be utilized in transistor configurations in accordance with other embodiments, e.g., such as depicted in FIG. 5B.

Figure 8:
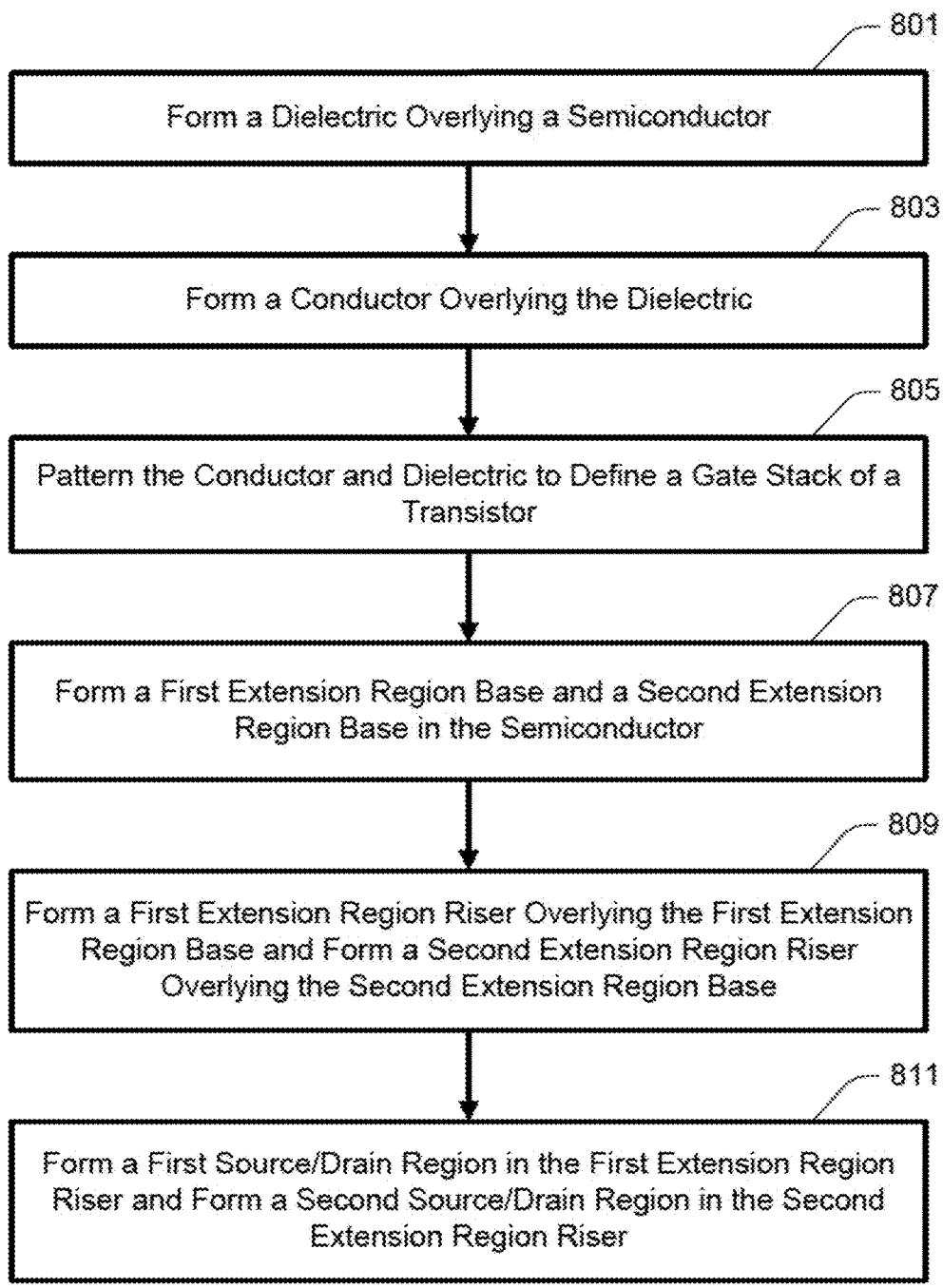
FIG. 8 is a flowchart of a method of forming a transistor in accordance with an embodiment.

FIG. 8 is a flowchart of a method of forming a transistor in accordance with an embodiment. At 801, a dielectric is formed overlying a semiconductor. The semiconductor might have a first conductivity type. At 803, a conductor is formed overlying the dielectric. At 805, the conductor and dielectric are patterned to define a gate stack of the transistor.

At 807, a first extension region base and a second extension region base are formed in the semiconductor. The first extension region base and the second extension region base might have a second conductivity type, different than the first conductivity type. The first extension region base and the second extension region base might further have a first conductivity level.

At 809, a first extension region riser and a second extension region riser are formed. The first extension region riser might be formed overlying the first extension region base, and the second extension region riser might be formed overlying the second extension region base. The first extension region riser and the second extension region riser might have the second conductivity type. The first extension region riser and the second extension region riser might further have the first conductivity level.

At 811, a first source/drain region and a second source/drain region are formed. The first source/drain region might be formed in the first extension region riser, and the second source/drain region might be formed in the second extension region riser. The first source/drain region and the second source/drain region might have the second conductivity type. The first source/drain region and the second source/drain region might further have conductivity level greater than the first conductivity level.

Figure 9:
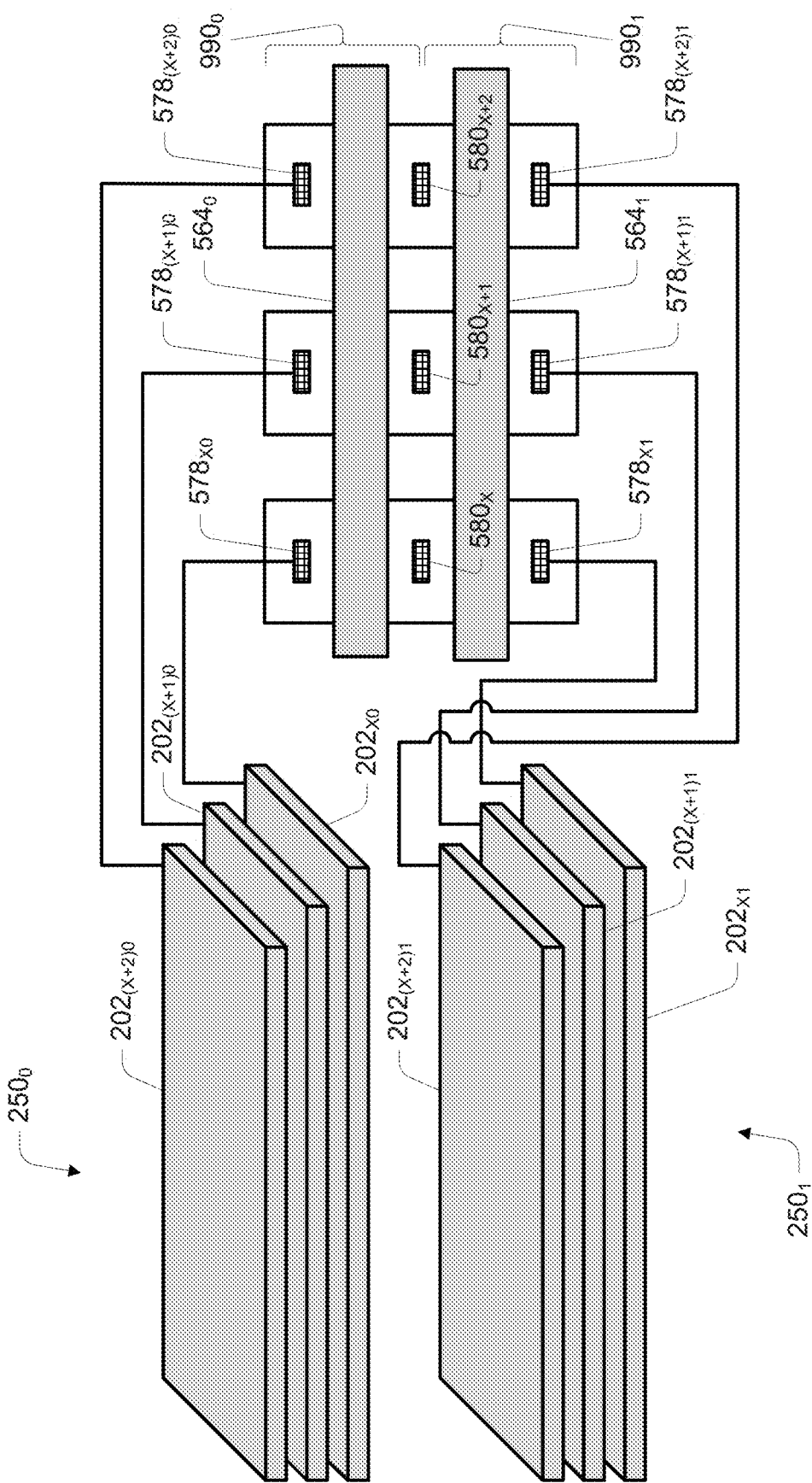
FIG. 9 conceptually depicts connection of a portion of a string driver connected to access lines of multiple blocks of memory cells in accordance with an embodiment.

FIG. 9 conceptually depicts connection of a portion of a string driver circuitry connected to access lines of multiple blocks of memory cells in accordance with an embodiment. For example, a first string driver $990_0$ might have transistors (not enumerated in FIG. 9) corresponding to conductor $564_0$ and connected between first contacts 580, e.g., first contacts $580_X$, $580_{X+1}$, and $580_{X+2}$, and corresponding second contacts 578, e.g., second contacts $578_{X0}$, $578_{(X+1)0}$, and $578_{(X+2)0}$, respectively, and a second string driver $990_1$ might have transistors (not enumerated in FIG. 9) corresponding to conductor 5641 and connected between first contacts 580, e.g., first contacts $580_X$, $580_{X+1}$, and $580_{X+2}$, and corresponding second contacts 578, e.g., second contacts $578_{X1}$, $578_{(X+1)1}$, and $578_{(X+2)1}$, respectively. The transistors of the string drivers $990_0$ and $990_1$ might correspond to the transistors 554 depicted in FIGS. 5A and 5B, for example.

The second contacts $578_{X0}$, $578_{(X+1)0}$, and $578_{(X+2)0}$ of the first string driver $990_0$ might be connected to word lines $202_{X0}$, $202_{(X+1)0}$, and $202_{(X+2)0}$, respectively, of a block of memory cells $250_0$. The word lines $202_{X0}$, $202_{(X+1)0}$, and $202_{(X+2)0}$ might represent only a portion of word lines of the block of memory cells $250_0$. For example, the block of memory cells $250_0$ might include N+1 word lines 202 such as depicted in FIG. 2A, and the word lines $202_{X0}$, $202_{(X+1)0}$, and $202_{(X+2)0}$ of the block of memory cells $250_0$ might correspond to word lines $202_X$, $202_{X+1}$, and $202_{X+2}$, respectively, of FIG. 2A.

The second contacts $578_{X1}$, $578_{(X+1)1}$, and $578_{(X+2)1}$ of the second string driver $990_1$ might be connected to word lines $202_{X1}$, $202_{(X+1)1}$, and $202_{(X+2)1}$, respectively, of a block of memory cells $250_1$. The word lines $202_{X1}$, $202_{(X+1)1}$, and $202_{(X+2)1}$ might represent only a portion of word lines of the block of memory cells $250_1$. For example, the block of memory cells $250_1$ might include N+1 word lines 202 such as depicted in FIG. 2A, and the word lines $202_{X1}$, $202_{(X+0)1}$, and $202_{(X+2)1}$ of the block of memory cells $250_1$ might correspond to word lines $202_X$, $202_{X+1}$, and $202_{X+2}$, respectively, of FIG. 2A.

The string drivers $990_0$ and $990_1$ might be a portion of the peripheral circuitry 226 of FIG. 2C. For example, the string driver $990_0$ might be formed under (e.g., at least partially under) the word lines $202_{X0}$, $202_{(X+1)0}$, and $202_{(X+2)0}$ of the block of memory cells $250_0$. Similarly, the string driver $990_1$ might be formed under (e.g., at least partially under) the word lines $202_{X1}$, $202_{(X+1)1}$, and $202_{(X+2)1}$ of the block of memory cells $250_1$.

The blocks of memory cells $250_0$ and $250_1$ might include more than one sub-block of memory cells. For example, the blocks of memory cells $250_0$ and $250_1$ might have an architecture corresponding to the array of memory cells 200B of FIG. 2B, where the array of memory cells 200B would have K+1 sub-blocks, with each sub-block including those memory cells selectively connected to a corresponding bit line 204 in response to one select line 215 of the select lines $215_0$-$215_K$. A pitch between such sub-blocks of memory cells might extend in the direction of the bit lines 204. Pitch refers to a distance between repeated elements in a structure possessing translational symmetry. For example, a pitch of the sub-blocks might represent a distance between one edge of a NAND string of memory cells 206 of the sub-block of memory cells corresponding to the select line $215_0$, and a corresponding edge of an adjacent NAND string of memory cells 206 of the sub-block of memory cells corresponding to the select line $215_1$.

Similarly, the string drivers $990_0$ and $990_1$ might have a pitch in the same linear direction as the sub-blocks of memory cells. With reference to FIG. 5A, this pitch of the string drivers $990_0$ and $990_1$ might correspond to one-half the distance 567, plus the distance 563, plus the distance 565, plus one-half the distance 569. For some embodiments, the pitch of the string drivers $990_0$ and $990_1$ might be less than three times the pitch of the sub-blocks of memory cells of the blocks of memory cells $250_0$ and $250_1$, respectively. For further embodiments, the pitch of the string drivers $990_0$ and $990_1$ might be less than 2.5 times the pitch of the sub-blocks of memory cells of the blocks of memory cells $250_0$ and $250_1$, respectively.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
   a voltage node;
   a load node; and
   a transistor connected between the voltage node and the load node, the transistor comprising:
      a dielectric overlying a semiconductor having a first conductivity type;
      a conductor overlying the dielectric;
      a first extension region base formed in the semiconductor and extending beyond one edge of the dielectric in a first direction away from the dielectric and in a second direction, opposite the first direction, beneath a first portion of the dielectric, wherein the first extension region base has a second conductivity type different than the first conductivity type, and wherein the first extension region base has a first conductivity level;
      a second extension region base formed in the semiconductor and extending beyond an opposite edge of the dielectric in the second direction away from the dielectric and in the first direction beneath a second portion of the dielectric, wherein the second extension region base has the second conductivity type, and wherein the second extension region base has the first conductivity level;
      a first extension region riser formed overlying the first extension region base and having the second conductivity type, wherein the first extension region riser has the first conductivity level, and wherein the first extension region riser is spaced apart from the conductor by a first lateral distance;
      a second extension region riser formed overlying the second extension region base and having the second conductivity type, wherein the second extension region riser has the first conductivity level, and wherein the second extension region riser is spaced apart from the conductor by a second lateral distance different than the first lateral distance;
      a first source/drain region formed in the first extension region riser and connected to the voltage node, wherein the first source/drain region has the second conductivity type and has a second conductivity level greater than the first conductivity level; and
      a second source/drain region formed in the second extension region riser and connected to the load node, wherein the second source/drain region has the second conductivity type and has the second conductivity level.

2. The apparatus of claim 1, wherein the semiconductor comprises a semiconductor material, wherein the first extension region base comprises the semiconductor material and a dopant species, and wherein the first extension region riser comprises the semiconductor material and the dopant species.

3. The apparatus of claim 1, wherein the semiconductor comprises a first semiconductor material, wherein the first extension region base comprises the first semiconductor material and a dopant species, and wherein the first extension region riser comprises a second semiconductor material, different than the first semiconductor material, and the dopant species.

4. The apparatus of claim 1, wherein a top surface of the first extension region riser and a top surface of the second extension region riser are above a top surface of the conductor.

5. The apparatus of claim 1, wherein the transistor is a first transistor, the load node is a first load node, the conductor is a first conductor, and the dielectric is a first dielectric, the apparatus further comprising:
- a second load node; and
- a second transistor connected between the voltage node and the second load node, the second transistor comprising:
  - a second dielectric overlying the semiconductor;
  - a second conductor overlying the second dielectric;
  - a third extension region base formed in the semiconductor and extending beyond one edge of the second dielectric in the first direction away from the second dielectric and in the second direction beneath a first portion of the second dielectric, wherein the third extension region base has the second conductivity type, and wherein the third extension region base has the first conductivity level;
  - a third extension region riser formed overlying the third extension region base and having the second conductivity type, wherein the third extension region riser has the first conductivity level; and
  - a third source/drain region formed in the third extension region riser and connected to the second load node, wherein the third source/drain region has the second conductivity type and has the second conductivity level;
  - wherein the first extension region base further extends in the first direction beyond an opposite edge of the second dielectric to extend beneath a second portion of the second dielectric.

6. The apparatus of claim 1, wherein the apparatus further comprises:
- an array of memory cells;
- a plurality of local access lines, wherein each local access line of the plurality of local access lines is commonly connected to control gates of a respective plurality of memory cells of the array of memory cells; and
- a plurality of global access lines, wherein each global access line of the plurality of global access lines is configured to supply a respective voltage level to a respective local access line of the plurality of local access lines;
- wherein the voltage node is a particular global access line of the plurality of global access lines; and
- wherein the load node is the respective local access line of the particular global access line.

7. The apparatus of claim 1, wherein the first lateral distance is greater than the second lateral distance.

8. A memory, comprising:
- an array of memory cells;
- a plurality of local access lines, wherein each local access line of the plurality of local access lines is commonly connected to control gates of a respective plurality of memory cells of the array of memory cells;
- a plurality of global access lines, wherein each global access line of the plurality of global access lines is configured to supply a respective voltage level to a respective local access line of the plurality of local access lines; and
- driver circuitry comprising a plurality of transistors with each transistor of the plurality of transistors having a first source/drain region connected to a respective local access line of the plurality of local access lines and having a second source/drain region connected to a respective global access line of the plurality of global access lines;
- wherein a particular transistor of the plurality of transistors comprises:
  - a dielectric overlying a semiconductor having a first conductivity type;
  - a conductor overlying the dielectric;
  - a first extension region base formed in the semiconductor and extending beyond one edge of the dielectric in a first direction away from the dielectric and in a second direction, opposite the first direction, beneath a first portion of the dielectric, wherein the first extension region base has a second conductivity type different than the first conductivity type, and wherein the first extension region base has a first conductivity level;
  - a second extension region base formed in the semiconductor and extending beyond an opposite edge of the dielectric in the second direction away from the dielectric and in the first direction beneath a second portion of the dielectric, wherein the second extension region base has the second conductivity type, and wherein the second extension region base has the first conductivity level;
  - a first extension region riser formed overlying the first extension region base and having the second conductivity type, wherein the first extension region riser has the first conductivity level, and wherein the first extension region riser is spaced apart from the conductor by a first lateral distance;
  - a second extension region riser formed overlying the second extension region base and having the second conductivity type, wherein the second extension region riser has the first conductivity level, and wherein the second extension region riser is spaced apart from the conductor by a second lateral distance different than the first lateral distance;
  - the first source/drain region formed in the first extension region riser and connected to its respective local access line as a load node, wherein the first source/drain region has the second conductivity type and has a second conductivity level greater than the first conductivity level; and
  - the second source/drain region formed in the second extension region riser and connected to its respective global access line as a voltage node, wherein the second source/drain region has the second conductivity type and has the second conductivity level.

9. The memory of claim 8, wherein the array of memory cells is a three-dimensional NAND memory array, and wherein the three-dimensional NAND memory array is formed over the driver circuitry.

10. The memory of claim 9, wherein the three-dimensional NAND memory array comprises a block of memory cells, the block of memory cells comprising:
- a first sub-block of memory cells of a plurality of sub-blocks of memory cells comprising a first plurality of strings of series-connected memory cells selectively connected to respective data lines of a plurality of data lines responsive to a first select line; and
- a second sub-block of memory cells of the plurality of sub-blocks of memory cells comprising a second plurality of strings of series-connected memory cells selectively connected to respective data lines of the plurality of data lines responsive to a second select line;

wherein a pitch of the driver circuitry in a direction of a data line of the plurality of data lines is less than three times a pitch of a sub-block of memory cells of the plurality of sub-blocks of memory cells in the direction of that data line of the plurality of data lines.

11. The memory of claim 8, wherein each transistor of the plurality of transistors comprises:
a respective dielectric overlying the semiconductor having the first conductivity type;
a respective conductor overlying its respective dielectric;
a respective first extension region base formed in the semiconductor and extending beyond one edge of its respective dielectric in the first direction away from the dielectric and in the second direction beneath a first portion of its respective dielectric, wherein the respective first extension region base has the second conductivity type, and wherein the respective first extension region base has the first conductivity level;
a respective second extension region base formed in the semiconductor and extending beyond an opposite edge of its respective dielectric in the second direction away from its respective dielectric and in the first direction beneath a second portion of its respective dielectric, wherein the second extension region base has the second conductivity type, and wherein the second extension region base has the first conductivity level;
a respective first extension region riser formed overlying its respective first extension region base and having the second conductivity type, and wherein the respective first extension region riser has the first conductivity level;
a respective second extension region riser formed overlying its respective second extension region base and having the second conductivity type, and wherein the respective second extension region riser has the first conductivity level;
a respective first source/drain region formed in its respective first extension region riser, wherein the respective first source/drain region has the second conductivity type and has a second conductivity level greater than the first conductivity level; and
a respective second source/drain region formed in its respective second extension region riser, wherein the respective second source/drain region has the second conductivity type and has the second conductivity level.

12. The memory of claim 11, wherein the respective conductors of each transistor of the plurality of transistors are commonly connected.

13. The memory of claim 8, wherein the first extension region riser and the first extension region base of the particular transistor each comprise a same semiconductor material.

14. The memory of claim 8, wherein the first extension region riser and the first extension region base of the particular transistor each have a single crystal lattice.

15. The memory of claim 8, wherein the first extension region base of the particular transistor extends in the first direction away from the one edge of the dielectric to an edge of an isolation region formed in the semiconductor.

16. The memory of claim 15, wherein the first extension region riser of the particular transistor is aligned with the edge of the isolation region.

17. The memory of claim 8, wherein the second conductivity level is at least an order of magnitude greater than the first conductivity level.

18. The memory of claim 8, wherein the driver circuitry is first driver circuitry, the plurality of local access lines is a first plurality of local access lines, the plurality of transistors is a first plurality of transistors, the dielectric is a first dielectric, and the conductor is a first conductor, the memory further comprising:
a second plurality of local access lines, each local access line of the second plurality of local access lines commonly connected to control gates of a respective plurality of memory cells of the array of memory cells; and
second driver circuitry comprising a second plurality of transistors with each transistor of the second plurality of transistors having a first source/drain region connected to a respective local access line of the second plurality of local access lines;
wherein a particular transistor of the second plurality of transistors comprises:
a second dielectric overlying the semiconductor;
a second conductor overlying the second dielectric;
a third extension region base formed in the semiconductor and extending beyond one edge of the second dielectric in the second direction away from the second dielectric and in the first direction beneath a first portion of the second dielectric, wherein the third extension region base has the second conductivity type, and wherein the third extension region base has the first conductivity level;
a third extension region riser formed overlying the third extension region base and having the second conductivity type, wherein the third extension region riser has the second conductivity level; and
the first source/drain region of the particular transistor of the second plurality of transistors formed in the third extension region riser, wherein the first source/drain region of the particular transistor of the second plurality of transistors has the second conductivity type and has the second conductivity level;
wherein the second extension region base further extends in the second direction beneath a second portion of the second dielectric; and
wherein a second source/drain region of the particular transistor of the second plurality of transistors is the second source/drain region of the particular transistor of the first plurality of transistors.

19. The memory of claim 18, wherein the array of memory cells is a three-dimensional NAND memory array comprising a first block of memory cells and a second block of memory cells, wherein the first block of memory cells is formed over the first plurality of transistors, and wherein the second block of memory cells is formed over the second plurality of transistors.

20. The memory of claim 19, wherein the first block of memory cells and the second block of memory cells each comprise a plurality of sub-blocks of memory cells, and wherein the plurality of sub-blocks of memory cells of a particular block of memory cells selected from a group consisting of the first block of memory cells and the second block of memory cells comprises:
a first sub-block of memory comprising a first plurality of strings of series-connected memory cells selectively connected to respective data lines of a plurality of data lines of the particular block of memory cells responsive to a first select line; and
a second sub-block of memory cells comprising a second plurality of strings of series-connected memory cells selectively connected to respective data lines of the plurality of data lines responsive to a second select line;

wherein a pitch of the first plurality of transistors and a pitch of the second plurality of transistors in a direction of a data line of the plurality of data lines are each less than three times a pitch of a sub-block of memory cells of the plurality of sub-blocks of memory cells of the particular block of memory cells in the direction of that data line of the plurality of data lines.

21. The apparatus of claim 8, wherein the second lateral distance is greater than the first lateral distance.

22. An apparatus, comprising:
 a voltage node;
 a load node; and
 a transistor connected between the voltage node and the load node, the transistor comprising:
  a dielectric overlying a semiconductor having a first conductivity type;
  a conductor overlying the dielectric;
  a first extension region base formed in the semiconductor and extending beyond one edge of the dielectric in a first direction away from the dielectric and in a second direction, opposite the first direction, beneath a first portion of the dielectric, wherein the first extension region base has a second conductivity type different than the first conductivity type, and wherein the first extension region base has a first conductivity level;
  a second extension region base formed in the semiconductor and extending beyond an opposite edge of the dielectric in the second direction away from the dielectric and in the first direction beneath a second portion of the dielectric, wherein the second extension region base has the second conductivity type, and wherein the second extension region base has the first conductivity level;
  a first extension region riser formed overlying the first extension region base and having the second conductivity type, wherein the first extension region riser has the first conductivity level, and wherein the first extension region riser is spaced apart from the conductor by a first lateral distance;
  a second extension region riser formed overlying the second extension region base and having the second conductivity type, wherein the second extension region riser has the first conductivity level, and wherein the second extension region riser is spaced apart from the conductor by a second lateral distance different than the first lateral distance;
  a first source/drain region formed in the first extension region riser and connected to the voltage node, wherein the first source/drain region has the second conductivity type and has a second conductivity level greater than the first conductivity level; and
  a second source/drain region formed in the second extension region riser and connected to the load node, wherein the second source/drain region has the second conductivity type and has the second conductivity level.

23. The apparatus of claim 22, wherein the first lateral distance is greater than the second lateral distance.

* * * * *